United States Patent
Yu et al.

(10) Patent No.: US 9,484,422 B2
(45) Date of Patent: Nov. 1, 2016

(54) HIGH-VOLTAGE METAL-OXIDE SEMICONDUCTOR TRANSISTOR

(71) Applicant: UNITED MICROELECTRONICS CORP., Hsin-Chu (TW)

(72) Inventors: Kun-Huang Yu, New Taipei (TW); Shih-Yin Hsiao, Chiayi County (TW); Wen-Fang Lee, Hsinchu (TW); Shu-Wen Lin, Hsinchu County (TW); Kuan-Chuan Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/882,462

(22) Filed: Oct. 14, 2015

(65) Prior Publication Data

US 2016/0043193 A1     Feb. 11, 2016

Related U.S. Application Data

(62) Division of application No. 14/273,538, filed on May 8, 2014, now Pat. No. 9,196,695.

(30) Foreign Application Priority Data

Apr. 4, 2014    (CN) .......................... 2014 1 0136033

(51) Int. Cl.
| | |
|---|---|
| H01L 29/76 | (2006.01) |
| H01L 29/423 | (2006.01) |
| H01L 29/78 | (2006.01) |
| H01L 29/66 | (2006.01) |
| H01L 29/40 | (2006.01) |
| H01L 29/08 | (2006.01) |
| H01L 21/266 | (2006.01) |
| H01L 21/28 | (2006.01) |
| H01L 21/265 | (2006.01) |

(52) U.S. Cl.
CPC ....... *H01L 29/42368* (2013.01); *H01L 21/266* (2013.01); *H01L 21/26506* (2013.01); *H01L 21/2822* (2013.01); *H01L 21/28026* (2013.01); *H01L 21/28158* (2013.01); *H01L 29/086* (2013.01); *H01L 29/0878* (2013.01); *H01L 29/401* (2013.01); *H01L 29/6659* (2013.01); *H01L 29/7816* (2013.01); *H01L 29/7833* (2013.01); *H01L 29/7834* (2013.01)

(58) Field of Classification Search
CPC ............. H01L 29/086; H01L 29/0878; H01L 29/6659; H01L 29/7816; H01L 29/7833; H01L 29/7834; H01L 21/0223; H01L 21/26506; H01L 21/266; H01L 21/28026; H01L 21/28158
USPC .......................................... 257/344; 438/287
See application file for complete search history.

(56) References Cited

U.S. PATENT DOCUMENTS 6,147,008 A     11/2000   Chwa
6,281,558 B1 *   8/2001   Sayama ............ H01L 21/82346
                                          257/371

(Continued)

*Primary Examiner* — Tu-Tu Ho
(74) *Attorney, Agent, or Firm* — Winston Hsu; Scott Margo

(57) ABSTRACT

The present invention provides a high-voltage metal-oxide-semiconductor (HVMOS) transistor comprising a substrate, a gate dielectric layer, a gate electrode and a source and drain region. The gate dielectric layer is disposed on the substrate and includes a protruded portion and a recessed portion, wherein the protruded portion is disposed adjacent to two sides of the recessed portion and has a thickness greater than a thickness of the recessed portion. The gate electrode is disposed on the gate dielectric layer. Thus, the protruded portion of the gate dielectric layer can maintain a higher breakdown voltage, thereby keeping the current from leaking through the gate.

12 Claims, 5 Drawing Sheets

(56) References Cited

U.S. PATENT DOCUMENTS

| | | |
|---|---|---|
| 6,855,994 B1 | 2/2005 | King |
| 2002/0127806 A1 | 9/2002 | Chen |
| 2006/0273391 A1 | 12/2006 | Diaz |
| 2013/0082312 A1* | 4/2013 | Hung ................ H01L 21/26506 257/292 |

* cited by examiner

HIGH-VOLTAGE METAL-OXIDE SEMICONDUCTOR TRANSISTOR

CROSS REFERENCE TO RELATED APPLICATIONS

This application is a Divisional of application Ser. No. 14/273,538 filed May 8, 2014, and included herein by reference.

BACKGROUND OF THE INVENTION

1. Field of the Invention

The present invention relates to a high-voltage component, more particularly, to a high-voltage metal-oxide-semiconductor (HVMOS) transistor.

2. Description of the Prior Art

High-voltage components are generally used in power circuits of flat panels or flash memory, having particular structures for sustaining high voltages, wherein the HVMOS transistors may function as switches and are broadly utilized in central processing unit (CPU) power supplies, power management systems, AC/DC converters, liquid crystal display (LCD) and plasma TV drivers, automobile electronic components, personal computer (PC) peripheral devices, small DC motor controllers, and other consumer electronic devices.

Generally, an oxide layer is formed between the gate electrode, and the source and drain electrodes in the HVMOS transistor to reduce the vertical electric field in the channel. However, with the progress of semiconductor and the trend towards scaling down the size of the semiconductor devices nowadays, the thicknesses of the oxide layer have to be decreased accordingly, thereby resulting in severe band-to-band tunneling effect and gate induced drain leakage (GIDL). Thus, the quality and reliability of electronic devices are seriously affected.

All the way through, the leakage current and reduced breakdown voltage is one of the key issues to impact the reliability of miniaturized semiconductor devices. Especially when the sizes of the semiconductor devices are minimized, the problem caused by the leakage current will become increasingly severe. Therefore, there is an urgent need of overcoming disadvantages of conventional HVMOS transistors, such as the gate induced drain leakage and other issues, in order to meet the practical requirement.

SUMMARY OF THE INVENTION

It is one of the objectives of the present invention to provide a high-voltage metal-oxide-semiconductor (HVMOS) transistor which includes a gate dielectric layer being thick at the two sides and being thin at the center, so that the HVMOS transistor can avoid gate induced drain leakage (GIDL).

It is one of the objectives of the present invention to provide a method of fabricating the HVMOS transistor, such that the HVMOS transistor which includes the gate dielectric layer being thick at the two sides and being thin at the center can be fabricated through a more efficient scheme.

To achieve the purpose described above, a preferred embodiment of the present invention provides a HVMOS transistor includes a substrate, a gate dielectric layer, a gate electrode and a source and drain region. The gate dielectric layer is disposed on the substrate and includes a protruded portion and a recessed portion, wherein the protruded portion is disposed adjacent to two sides of the recessed portion and has a thickness greater than a thickness of the recessed portion. The gate electrode is disposed on the gate dielectric layer and the source and drain region is embedded in the substrate, at two sides of the gate electrode.

To achieve the purpose described above, a preferred embodiment of the present invention also provides a method of fabricating HVMOS transistor, comprising: providing a substrate at first; forming a patterned shielding layer; performing an ion implantation by using the patterned shielding layer as a mask to form a first doped region, and removing the patterned shielding layer; performing a thermal process to form a gate dielectric layer on the substrate, wherein the gate dielectric layer comprises a protruded portion and a recessed portion, the protruded portion is disposed adjacent to two sides of the recessed portion and has a thickness greater than a thickness of the recessed portion, and a border between the protruded portion and the recessed portion is vertically aligned with a side edge of the first doped region; forming a gate electrode on the gate dielectric layer; and forming a source and drain region embedded in the substrate, at two sides of the gate electrode.

Since the dielectric layer of the HVMOS transistor of the present invention is formed by implanting fluorine or oxygen in the substrate at first and performing a thermal process on the substrate, the dielectric layer will be thick at the two sides and thin in the center. Also, due to such arrangement, it is sufficient to omit unnecessary mask and etching processes and to fabricate the HVMOS transistor of the present invention in a simplified scheme. It is noted that, the gate dielectric layer includes a recessed portion and a protruded portion, wherein the protruded portion is disposed adjacent to the two sides of the recessed portion and has a thickness greater than a thickness of the recessed portion. Therefore, the protruded portion of the gate dielectric layer can sustain a higher breakdown voltage, thereby efficiently avoiding the gate induced drain leakage.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying figures to clarify the contents and effects to be achieved.

The present provides a high-voltage metal-oxide semiconductor (HVMOS) transistor and a method of fabricating HVMOS transistor. In the present invention, the HVMOS transistor can refer to any HVMOS transistors known by a person who has ordinary skill in the arts. In one embodiment, the HVMOS transistor of the present invention refers to the MOS transistor having an initial voltage between 7 volts and 13 volts, and a breakdown voltage higher than 200 volts.

Figure 1:
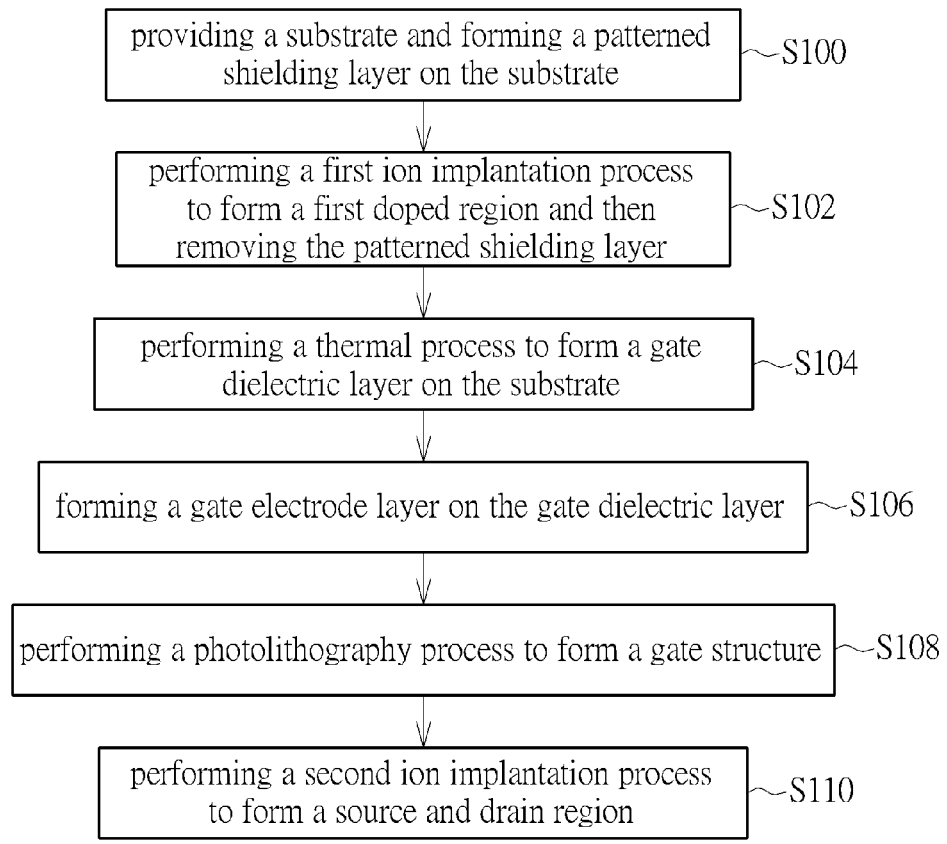
FIG. 1 is a flow chart illustrating a method of fabricating HVMOS transistor in accordance with a preferred embodiment of the present invention.

Referring to FIGS. 1-7, FIGS. 1-7 illustrate a method of fabricating HVMOS transistor according to one preferred embodiment of the present invention, wherein, FIG. 1 is a flowchart illustrating the fabrication method and FIGS. 2-7 are diagrams illustrating the fabrication method. The HVMOS transistor of the present invention can be a high-voltage positive channel metal-oxide-semiconductor (HVPMOS) transistor or a high-voltage negative channel metal-oxide-semiconductor (HVNMOS) transistor, and a method of fabricating the same includes the following steps.

Figure 2:
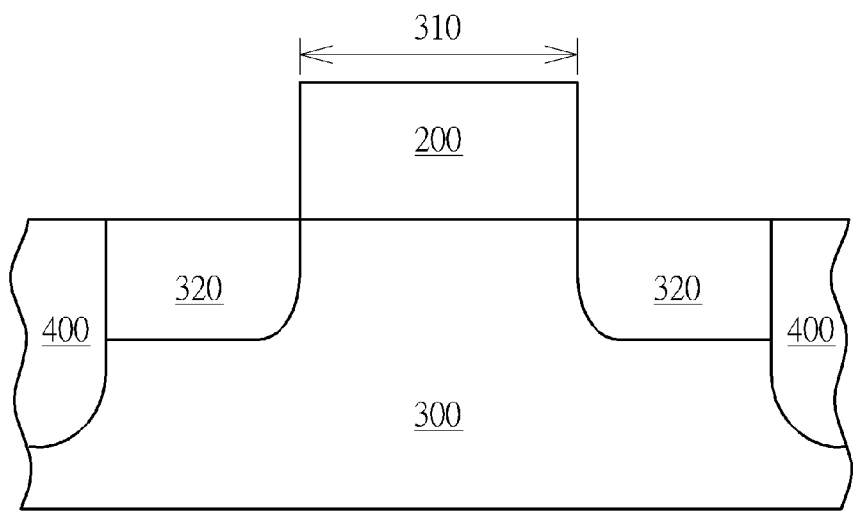
FIGS. 2-7 are diagrams illustrating the method of fabricating HVMOS transistor in accordance with the preferred embodiment of the present invention.

As shown in FIG. 1 and FIG. 2, a substrate 300 is provided firstly, and a patterned shielding layer 200 is formed on the substrate 300 (step S100). Precisely, the substrate 300 has a channel region 310 defined thereon, and the patterned shielding layer 200 covers the channel region 310 of the substrate 300 and uncovers other parts of the substrate 300. In one embodiment, the substrate 300 can include a silicon substrate, an epitaxial silicon substrate, a silicon germanium (SiGe) substrate, a silicon carbon (SiC) substrate or a silicon-on-insulator (SOI) substrate, but not limited thereto. The patterned shielding layer 200 can be any suitable materials which can be used as a mask of ion implantation, such as silicon nitride (SiN).

In other variant embodiments, before forming the patterned shielding layer 200, a plurality of shallow trench isolations (STIs) 400 can be formed previously to electrically isolate each MOS transistor. In one embodiment, the STIs 400 can be fabricated through a method including: etching the substrate 300 at first to form a plurality of trenches (not shown in the drawings), filling a dielectric material, such as silicon dioxide ($SiO_2$), silicon nitride, silicon oxynitride (SiON) or $SiO_2$—SiN—$SiO_2$ in these trenches, and performing a planarization process, such as chemical mechanical polish (CMP) process, to remove unnecessary dielectric material and to form the STIs 400.

Figure 3:
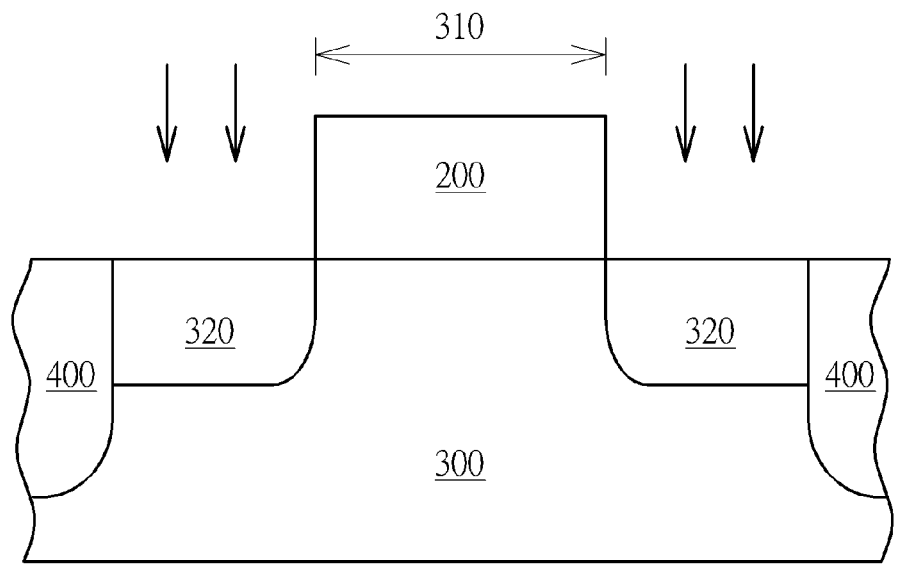

Next, as shown in FIG. 1 and FIG. 3, a first ion implantation process is carried out to form a first doped region 320, and the patterned shielding layer 200 is then removed (step S102). In the first ion implantation process, the patterned shielding layer 200 is used as a mask to form the first doped region 320 in the substrate 300 at two sides of the channel region 310, wherein the first doped region 320 includes a dopant of a first conductive type, such as $N^+$ or $P^+$. In one embodiment, the first doped region 320 is disposed at the two sides of the channel region 310 and extends to the STIs 400. The first doped region 320 has a lower doped concentration, for example between $5 \times 10^{12}$ and $5 \times 10^{13}$ ions/$cm^2$, and the first doped region 320 can be used as a drift region of the HVMOS transistor of the present invention. In one embodiment, the first doped region 320 is formed by providing the dopant of the first conductive type and also providing for example fluorine or oxygen, and performing the ion implantation process at 5 to 100 kiloelectron-volts (keV). In a preferred embodiment, the first doped region 320 is formed further by providing an inert gas, such as argon, as a carrier. In other embodiments, the dopant of the first conductive type can be implanted in the substrate 300 previously, followed by implanting other dopants, such as fluorine and oxygen. Therefore, in additional to the dopant of the first conductive type, the first doped region 320 also includes other suitable dopants, such as oxygen, fluorine, or other composite dopant due to such ion implantation process, wherein, the doped concentration of the oxygen or fluorine is preferably between $5 \times 10^{12}$ and $5 \times 10^{15}$ ions/$cm^2$, more preferably to $2 \times 10^{15}$ ions/$cm^2$. In the present embodiment, the first doped region 320 preferably includes $8 \times 10^{12}$ ions/$cm^2$ of fluorine.

Figure 4:
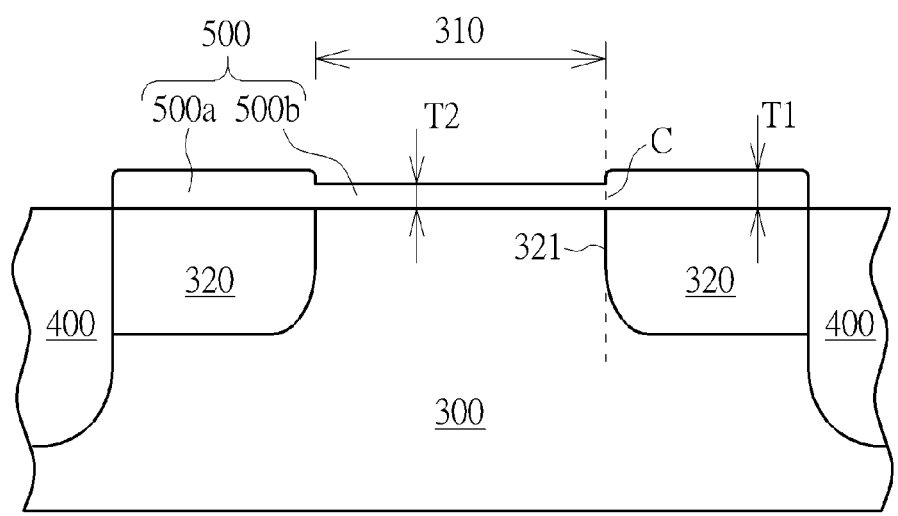

Next, as shown in FIG. 1 and FIG. 4, a thermal process is carried out to form a gate dielectric layer 500 on the substrate 300 (step S104). The gate dielectric layer 500 can include an oxide layer, a nitride layer or a high-K dielectric layer. In the present embodiment, the thermal process can be a thermal oxidation process, e.g. forming the gate dielectric layer 500 with steam, oxygen, or steam including a small amount of hydrogen chloride (HCl), nitrogen or oxygen, at 400° C. to 1000° C. and 600 to 760 Torr, but not limited thereto. In the present embodiment, a portion of the gate dielectric layer 500 which covers the first doped region 320 has a thick layer due to the dopant of the first doped region 320. On the other hand, a portion of the gate dielectric layer 500 which uncovers the first doped region 320 (namely, the portion corresponding to the channel region 310) has a relatively thinner layer since there is no dopant therebelow. Therefore, the gate dielectric layer 500 includes a structure being thick at the two sides and thin at the center, such as a U-shape structure or a battlement structure, wherein the thick part of the structure can be defined as a protruded portion 500a and the thin part of the structure can be defined as a recessed portion 500b, and the recessed portion 500b is surrounded by the protruded portion 500a and entirely overlaps the channel region 310 of the substrate 300 in a horizontal direction. Preferably, the protruded portion 500a has thickness T1, between around 85 and 95 angstroms, and more preferably to 90 angstroms; and the recessed portion has a thickness T2 between about 65 and 75 angstroms, and more preferably to 70 angstroms. In one embodiment, the difference of thickness between the protruded portion 500a and the recessed portion 500b is approximately more than 20 angstroms, but not limited therefore. It is noted that, the protruded portion 500a of the gate dielectric layer 500 overlaps the first doped region 320 in the horizontal direction, and a border C between the protruded portion 500a and the recessed portion 500b is vertically aligned with a side edge 321 of the first doped region 320.

Figure 5:
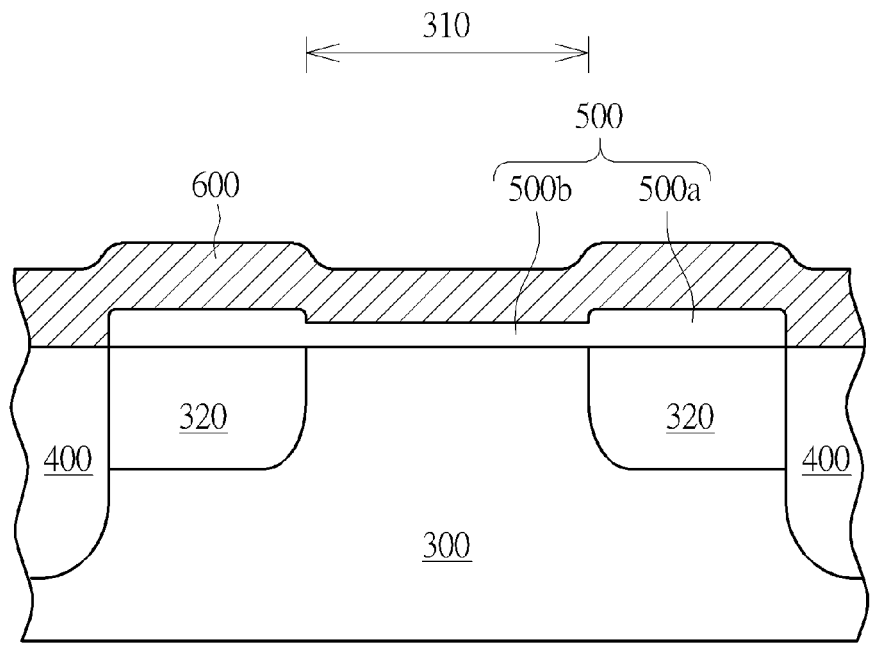

As shown in FIG. 1 and FIG. 5, a gate electrode layer 600 is formed on the gate dielectric layer 500 (step S106). In one embodiment, the gate electrode layer 600 is conformally deposited on the gate dielectric layer 500, so that the gate electrode layer 600 may have the same U shape structure as the gate dielectric layer 500, being thick at the two sides and thin at the center. However, in another embodiment, a planarization process can be carried out additionally after forming the gate electrode layer 600, to remove a part of the gate electrode layer 600 and to form an even top surface. In another embodiment, the gate electrode layer 600 can include any suitable conductive material, such as polysilicon layer, silicide layer or metal layer. In another embodiment, a high-k dielectric layer (not shown in the drawings) can be further formed between the gate dielectric layer 500 and the gate electrode layer 600 conformally.

Figure 6:
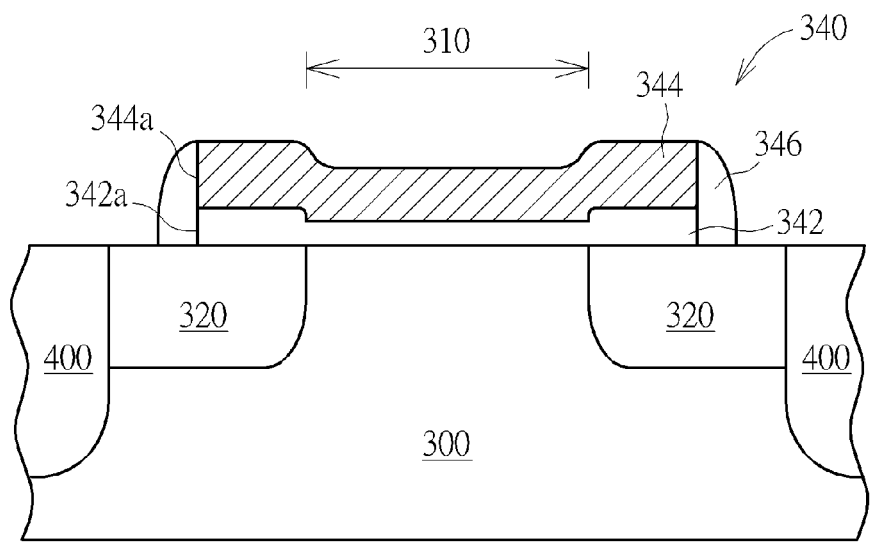

Then, as shown in FIG. 1 and FIG. 6, a photolithography process is carried out to pattern the gate electrode layer 600 and to form a gate structure 340 (step S108). In the present embodiment, both of the gate dielectric layer 500 and the gate electrode layer 600 are patterned in this step, such that, the gate structure 340 of the present embodiment includes a patterned gate electrode 344 and a patterned gate dielectric layer 342, and a side wall 344a of the gate electrode 344 is vertically aligned with a side wall 342a of the gate dielectric layer 342. Also, both of the side wall 344a of the gate electrode 344 and the side wall 342a of the gate dielectric layer 342 are disposed over the first doped region 320. In one embodiment, the gate structure 340 can further include a spacer 346 formed on the side wall 344a of the gate electrode 344, wherein, the spacer 346 directly contacts to the first doped region 320 and overlaps the first doped region 320 in the horizontal direction. The spacer 346 can be a monolayered structure or a multilayered structure, and for example include high temperature oxide (HTO), SiN, $SiO_2$, SiON or a composite thereof.

Figure 7:
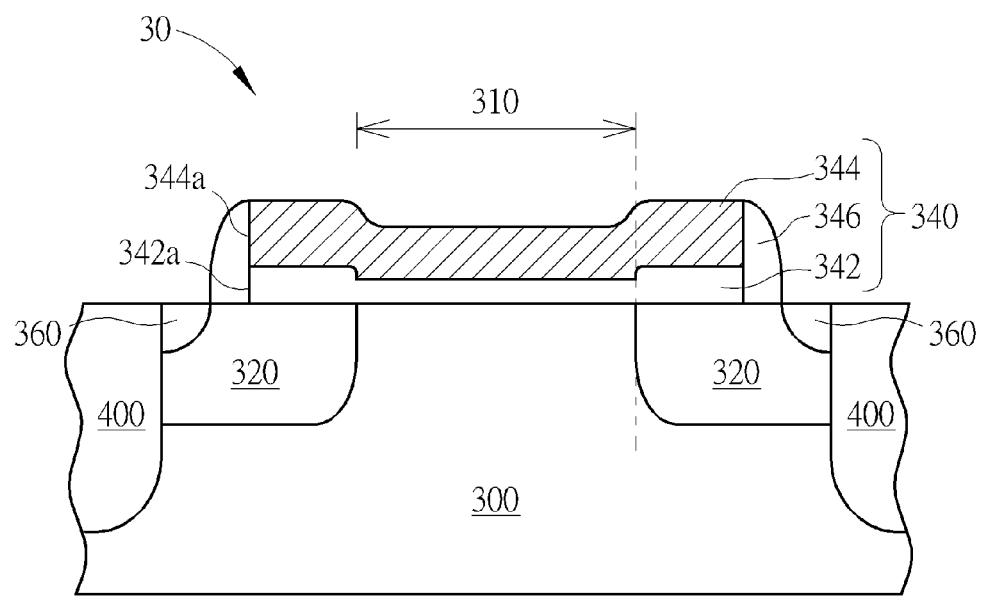

As following, as shown in FIG. 1 and FIG. 7, a second ion implantation process is carried out to form a source and drain region 360 (step S110). In the second ion implantation process, the gate structure 340 and the spacer 346 are used as a mask to form a self-aligned source and drain region 360 embedded in the substrate 300 at two sides of the gate structure 340. The source and drain region 360 is adjacent to the first doped region 320 and preferably is a heavy doped region, wherein a doped concentration of the source and drain region 360 is higher than the doped concentration of the first doped region 320, for example between $1 \times 10^{15}$ and $5 \times 10^{15}$ ions/cm$^2$. The source and drain region 360 and the first doped region can be the same conductive type, e.g. both in the first conductive type, such as N$^+$ or P$^+$.

Figure 8:
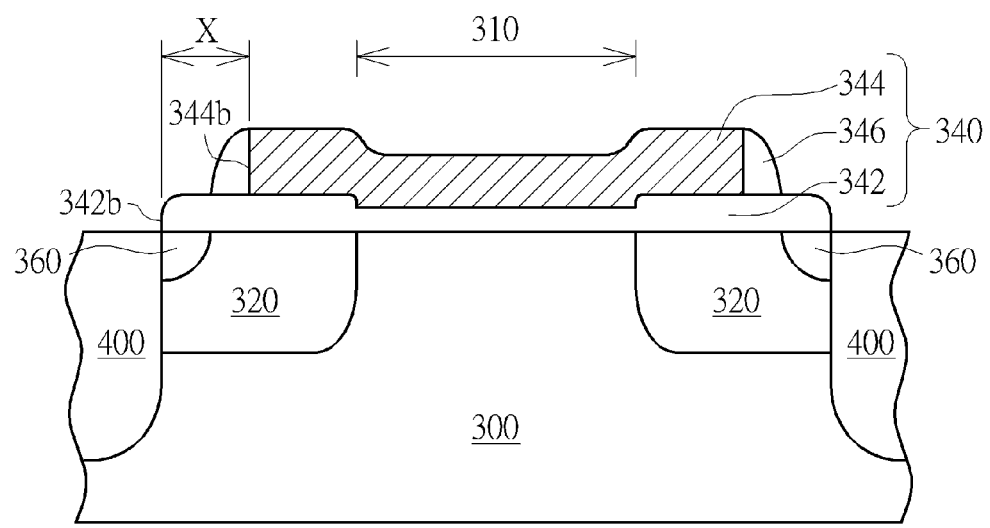
FIG. 8 is a diagram illustrating a method of fabricating HVMOS transistor in accordance with another preferred embodiment of the present invention.

As shown in FIG. 8, FIG. 8 is a diagram illustrating a method of fabricating HVMOS transistor in accordance with another preferred embodiment of the present invention. The formal steps in this embodiment are similar to those as in FIG. 2 to FIG. 5 in the aforementioned embodiment and are not repeatedly described herein. After forming the gate electrode layer 600 in FIG. 5, please refer to FIG. 8, where the gate electrode layer 600 is patterned. In this step, only the gate electrode layer 600 is patterned through for example a photolithography process, and the gate dielectric layer 500 is used as an etch stop layer and is substantially not etched in this step. Therefore, in the gate structure 340 of the present embodiment, a side wall 344b of the gate electrode 344 and a side wall 342b of the gate dielectric layer 342 are staggered and the side wall 344b of the gate electrode 344 is not vertically aligned with the side wall 342b of the gate dielectric layer 342. In other words, the side wall 344b of the gate electrode 344 is spaced from the side wall 342b of the gate dielectric layer 342 in a radial gap X. In addition, in the following step, the spacer 346 is then formed on the side wall 344b of the gate electrode 344, wherein, the side wall 344b is also disposed on the protrude portion of the gate dielectric layer 342.

Through aforementioned embodiments, it is noted that the gate dielectric layer of the HVMOS transistor of the present invention is formed by implanting the dopant of the first conductive type and others (such as fluorine or oxygen) in the substrate and performing a thermal oxidation process on the substrate, so as to form the gate dielectric layer in the U shape structure. In comparison with the conventional art requiring at least two masks to define the first doped region and the gate dielectric layer respectively, the present invention can omit unnecessary mask and etching processes and fabricate the HVMOS transistor in a simplified scheme. However, it is well known in the art, the HVMOS transistor of the present invention is not limited to be fabricated through the aforementioned embodiments and steps, and may have other different preferred embodiments.

According to the aforementioned method, a HVMOS transistor 30 in accordance with the preferred embodiment of the present invention is obtained, as shown in FIG. 7. The HVMOS transistor 30 includes a gate dielectric layer 342 in a U shape structure or a battlement structure, and a double diffusion drain region. It is noted that, the gate dielectric later 342 has different thicknesses at the two sides and the center, and the difference of the thicknesses between the two sides and the center is more than 20 angstroms. Wherein, the two sides of the gate dielectric layer 342 is thick, being between around 85 to 95 angstroms, so that the two sides of the gate dielectric layer 342 can sustain higher breakdown voltages. Therefore, the HVMOS transistor 30 of the present invention will have improved breakdown voltage, thereby efficiently avoiding the gate induced drain leakage, in comparison with conventional HVMOS transistor. On the other hand, since the thickness of the center of the gate dielectric layer 342 is relatively thin, such as between around 65 to 75 angstroms, the driving voltage can be reduced to maintain a preferable efficiency. In the present embodiment, the two sides of the gate dielectric layer 342 overlap the first doped region 320 in the horizontal direction, and a side edge of the first doped region 320 is vertically aligned with a border between the two sides and the center of the gate dielectric layer 342 (marking as the dotted line in FIG. 7). In one embodiment, the first doped region 320 includes the dopant of the first conductive type and at least one of fluorine and oxygen, wherein the first conductive type can be N$^+$ or P$^+$.

In one embodiment, the first doped region 320 and the source and drain region 360 include the same conductive type, and the doped concentration of the first doped region 320 is less than the doped concentration of the source and drain region 360.

In one embodiment, the side wall 344a of the gate electrode 344 is vertically aligned with the side wall 342a of the gate dielectric layer 342. And in another embodiment, the side wall 344b of the gate electrode 344 is not vertically aligned with the side wall 342b of the gate dielectric layer 342.

In one embodiment, the HVMOS transistor 30 can further include a spacer 346 disposed on the side wall 344a of the gate electrode 344 and directly contacted with the first doped region 320. And in another embodiment, as shown in FIG. 8, the spacer 346 is disposed on the two sides of the gate dielectric layer 342.

The following description will detail the different embodiments of the HVMOS transistor of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 9:
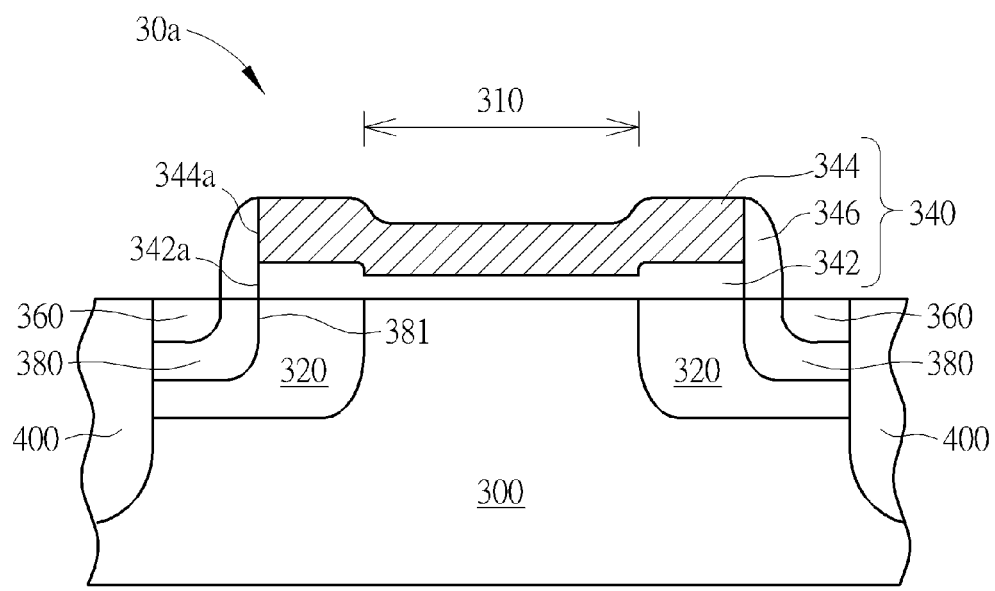
FIG. 9 is a diagram illustrating a HVMOS transistor in accordance with the other preferred embodiment of the present invention.

Referring to FIG. 9, FIG. 9 is a diagram illustrating a HVMOS transistor 30a in accordance with the other preferred embodiment of the present invention. The methods of fabricating the HVMOS transistor 30a in this embodiment are similar to those as in FIG. 2 to FIG. 6 in the aforementioned embodiment and are not repeatedly described herein. After forming the gate structure 340 in FIG. 6, another ion implantation process is carried out by directly using the gate structure 340 as a mask, to form a second doped region 380 embedded in the substrate 300 at the two sides of the gate structure 340 and adjacent to the first doped region 320. After that, the spacer 346 is formed and the source and drain region 360 is then formed by using the gate structure 340 and the spacer 346 as a mask. In comparison with the aforementioned embodiments, the HVMOS transistor 30a of the present embodiment is characterized by disposing the second doped region 380 between the first doped region 320 and the source and drain region 360, wherein, the side wall 344a of the gate electrode 344 is vertically aligned with a side edge 381 of the second doped region 380 and the spacer 346 is disposed on the side wall 344a of the gate electrode 344 and directly contacts to the second doped region 380.

It is noted that, the second doped region 380 is preferably a light doped region, and a doped concentration of the second doped region 380 is for example between $1 \times 10^{14}$ and $2 \times 10^{15}$ ions/cm$^2$, which is preferably higher than that of the first doped region 320 and lower than that of the source and drain region 360. The second doped region 380 and the first doped region 320 can be the same conductive type, e.g. both in the first conductive type, such as N$^+$ or P$^+$. In other words, the first doped region 320, the second doped region 380, and the source and drain region 360 are sequentially arranged outwardly in the present embodiment, wherein, the first doped region 320 has a lightest doped concentration and the source and drain region 360 has the heaviest doped concentration among them, but not limited thereto.

Besides, the HVMOS transistor of the present invention can be further combined with other components, such as a low-voltage metal-oxide-semiconductor (LVMOS) transistor or a superior high-voltage metal-oxide-semiconductor (SHVMOS) transistor, to form a semiconductor device according to practical requirements, but not limited thereto. The HVMOS transistor of the present invention can also be applied to other variant MOS transistors, for example, vertical double-diffused metal-oxide-semiconductor (VDMOS) transistor or lateral diffused metal-oxide-semiconductor (LDMOS) transistor, but not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-voltage metal-oxide-semiconductor (HVMOS) transistor, comprising:
   a substrate;
   a gate dielectric layer, disposed on the substrate, the gate dielectric layer comprising a protruded portion and a recessed portion, and the protruded portion being disposed at two sides of the recessed portioned and comprising a thickness greater than a thickness of the recessed portion;
   a first doped region embedded in the substrate, wherein a border between the protruded portion and the recessed portion is vertically aligned with a side edge of the first doped region;
   a gate electrode, disposed on the gate dielectric layer;
   a spacer, disposed on a side wall of the gate electrode and contacted with the first doped region; and
   a source and drain region, embedded in the substrate at two sides of the gate electrode.

2. The HVMOS transistor according to claim 1, wherein the thickness of the protruded portion is substantially between 85 and 95 angstroms and the thickness of the recessed portion is substantially between 65 and 75 angstroms.

3. The HVMOS transistor according to claim 1, wherein the first doped region overlaps the recessed portion in a horizontal direction.

4. The HVMOS transistor according to claim 1, wherein the first doped region comprises a dopant of a first conductive type and the dopant comprises one of oxygen and fluorine.

5. The HVMOS transistor according to claim 1, wherein the first doped region and the source and drain region comprises a same conductive type.

6. The HVMOS transistor according to claim 5, wherein a doped concentration of the first doped region is less than a doped concentration of the source and drain region.

7. The HVMOS transistor according to claim 1, wherein a side wall of the gate electrode is vertically aligned with a side wall of the gate dielectric layer.

8. The HVMOS transistor according to claim 1, wherein a side wall of the gate electrode is not vertically aligned with a side wall of the gate dielectric layer.

9. The HVMOS transistor according to claim 1, further comprising a spacer, disposed on a side wall of the gate electrode and on the protruded portion of the gate dielectric layer.

10. The HVMOS transistor according to claim 1, further comprising a second doped region disposed between the first doped region and the source and drain region, and a side edge of the second doped region being vertically aligned with a side wall of the gate electrode.

11. The HVMOS transistor according to claim 10, further comprising a spacer disposed on the side wall of the gate electrode and the spacer directly contacting with the second doped region.

12. The HVMOS transistor according to claim 10, wherein a doped concentration of the second doped region is less than a doped concentration of the source and drain region.

* * * * *